(12) United States Patent
Shih et al.

(10) Patent No.: US 7,892,712 B2
(45) Date of Patent: Feb. 22, 2011

(54) EXPOSURE METHOD

(75) Inventors: Chiang-Lin Shih, Taipei County (TW); Feng-Yi Chen, Taoyuan County (TW); Kuo-Yao Cho, Taichung County (TW)

(73) Assignee: Nanya Technology Corporation, Taoyuan (TW)

( * ) Notice: Subject to any disclaimer, the term of this patent is extended or adjusted under 35 U.S.C. 154(b) by 383 days.

(21) Appl. No.: 12/125,074

(22) Filed: May 22, 2008

(65) Prior Publication Data

US 2009/0111060 A1    Apr. 30, 2009

(30) Foreign Application Priority Data

Oct. 31, 2007    (TW) .................................. 96141052

(51) Int. Cl.
*G03F 9/00*    (2006.01)
*G03C 5/00*    (2006.01)

(52) U.S. Cl. .......................................... 430/22; 430/30

(58) Field of Classification Search ................... 430/22, 430/30

See application file for complete search history.

(56) References Cited

U.S. PATENT DOCUMENTS 6,950,188 B2    9/2005    Wu et al.

OTHER PUBLICATIONS

"1st Office Action of China counterpart application", issued on Apr. 28, 2010, p. 1-p. 4.

*Primary Examiner*—Christopher G Young
(74) *Attorney, Agent, or Firm*—Jianq Chyun IP Office

(57) ABSTRACT

An exposure method suitable for a photolithography process is described. First, a wafer with a group of alignment marks formed thereon is provided. A first alignment step is conducted by using the group of the alignment marks on the wafer to obtain a first calibration data. Next, a second alignment step is conducted by using a portion of the group of alignment marks on the wafer to obtain a second calibration data. The first calibration data is then compared with the second calibration data to obtain a comparison result. Next, a photoresist exposure step is conducted on the wafer according to the comparison result.

14 Claims, 2 Drawing Sheets

EXPOSURE METHOD

CROSS-REFERENCE TO RELATED APPLICATION

This application claims the priority benefit of Taiwan application serial no. 96141052, filed on Oct. 31, 2007. The entirety of the above-mentioned patent application is hereby incorporated by reference herein and made a part of specification.

BACKGROUND OF THE INVENTION

1. Field of the Invention

The present invention generally relates to a semiconductor process, and more particularly, to an exposure method suitable for a photolithography process.

2. Description of Related Art

Along with rapid progress of semiconductor process technology, further advancement in the operation speed and efficiency of semiconductor devices is demanded, which needs continuously increased compactness of a whole circuit component to increase the integration thereof. In general, in designing compact semiconductor devices, the photolithography process plays a significant role in the entire process.

In a semiconductor process, the patterning of film layers or doping are performed by using a photolithography process to define a desired region. The photolithography process is performed by forming a photoresist layer on the surface of a wafer, followed by conducting a photoresist exposure step and a developing step, so as to transfer the mask patterns onto the photoresist layer to obtain a patterned photoresist layer.

Among the vital factors affecting a photolithography process, in addition to critical dimensions, the most important factor is alignment accuracy. In particular, to meet the higher and higher device integration today, the pre-exposure wafer alignment is more important. A semiconductor device usually needs a plurality of photolithography processes to be completed, and therefore, to correctly transfer mask patterns onto a wafer, the alignments between a work layer with other layers on the wafer must be done before conducting each photoresist exposure step of photolithography. Thus, degradation of the yield on wafer due to inappropriate pattern transfer can be avoided and even scrapping of an entire batch of wafers can be prevented.

The conventional wafer alignment step is usually conducted by an employed exposure apparatus itself, followed by using the data of the wafer alignment to calibrate the exposure apparatus for conducting a successive photoresist exposure step. Since an exposure apparatus is unable to simultaneously conduct wafer alignment step and photoresist exposure step to meet the mass production requirement, the throughput of an exposure apparatus is much limited. In particular, along with an continuously enhancement of device integration, more alignment marks measured on a same wafer are required to provide successive data for calibrating the exposure apparatus, which makes the situation of low throughput more serious.

In addition, in order to improve the above-mentioned low throughput problem of photoresist exposure, during conducting an pre-exposure alignment step with an exposure apparatus, it is very common to conduct alignment merely on a wafer chosen from a batch of wafers or several batches of wafers and then to calibrate the exposure apparatus by taking the alignment result obtained from aligning a single wafer as the base to align all wafers of a batch or several batches, which may more affect the alignment accuracy. Since the accuracy in transferring a mask pattern onto the wafer is significant which directly affect the quality of a semiconductor process, how to effectively increase the throughput and promote the alignment accuracy to ensure higher quality of a photoresist pattern becomes one of important issues for the related manufactures to solve.

SUMMARY OF THE INVENTION

Accordingly, the present invention is directed to an exposure method capable of effectively improving the alignment accuracy of wafers.

The present invention is also directed to an exposure method to reduce the time needed by a photolithography process and thereby increase the throughput.

The present invention provides an exposure method suitable for a photolithography process. First, a wafer with a group of alignment marks formed thereon is provided. A first alignment step is conducted by using the group of the alignment marks on the wafer to obtain a first calibration data. Next, a second alignment step is conducted by using a portion of the group of alignment marks on the wafer to obtain a second calibration data. The first calibration data is then compared with the second calibration data to obtain a comparison result. Next, a photoresist exposure step is conducted on the wafer according to the comparison result.

In an embodiment of the present invention, the first alignment step is conducted in an alignment tool and the second alignment step is conducted in an exposure tool, wherein the alignment tool is an off-line system.

The present invention also provides an exposure method suitable for a photolithography process. First, a first alignment step is conducted on a first batch of wafers by using an alignment tool. After conducting the first alignment step on the first batch of wafers, a second alignment step is conducted on the first batch of wafers by using an exposure apparatus. Next, the resulting data obtained by the first alignment step on the first batch of wafers are compared with the resulting data obtained by the second alignment step on the first batch of wafers to get a comparison result. Next, the exposure apparatus is calibrated according to the comparison result. Furthermore, a photoresist exposure step is conducted on the first batch of wafers by using the exposure apparatus.

In an embodiment of the present invention, the first alignment step includes conducting a precise alignment measurement on the first batch of wafers.

In an embodiment of the present invention, the second alignment step includes conducting a coarse alignment measurement on the first batch of wafers.

In an embodiment of the present invention, the exposure method further includes conducting the first alignment step on a second batch of wafers by using the alignment tool.

In an embodiment of the present invention, the first alignment step on the second batch of wafers and the second alignment step on the first batch of wafers are simultaneously conducted.

In an embodiment of the present invention, the number of the alignment marks measured by the first alignment step is greater than that of the alignment marks measured by the second alignment step.

In an embodiment of the present invention, the alignment tool is an off-line alignment tool, wherein the off-line alignment tool is coupled to the exposure apparatus.

In an embodiment of the present invention, calibrating the exposure apparatus according to the comparison result includes utilizing a feedback mechanism, which automatically feeds back the comparison result into the exposure apparatus for calibration.

Since the present invention adopts a scheme including conducting a precise first alignment step on a wafer, followed by conducting a coarse second alignment step on the wafer and a photoresist exposure step. Therefore, the present invention is able to promote the alignment accuracy on the wafer to ensure the correctness of transferring a pattern.

In addition, the exposure method of the present invention uses an alignment tool independent from the exposure apparatus to conduct a precise first alignment step on the wafer, then uses the exposure apparatus to sequentially conduct a rough second alignment step prior to an exposure step on the wafer. Thus, the exposure apparatus is calibrated by a correlation between the result of the first alignment step and the result of the second alignment step, alignment accuracy of the exposure apparatus may be effectively promoted. Moreover, the number of the alignment marks measured by the exposure apparatus in the second alignment step is less than that in the first alignment step in the present invention. The independently disposed alignment tool and the exposure apparatus are able to simultaneously conduct the processes of themselves, and therefore, the exposure method of the present invention further reduces the alignment time of the exposure apparatus, so that the exposure apparatus can focus on conducting the photoresist exposure step to achieve a higher throughput.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
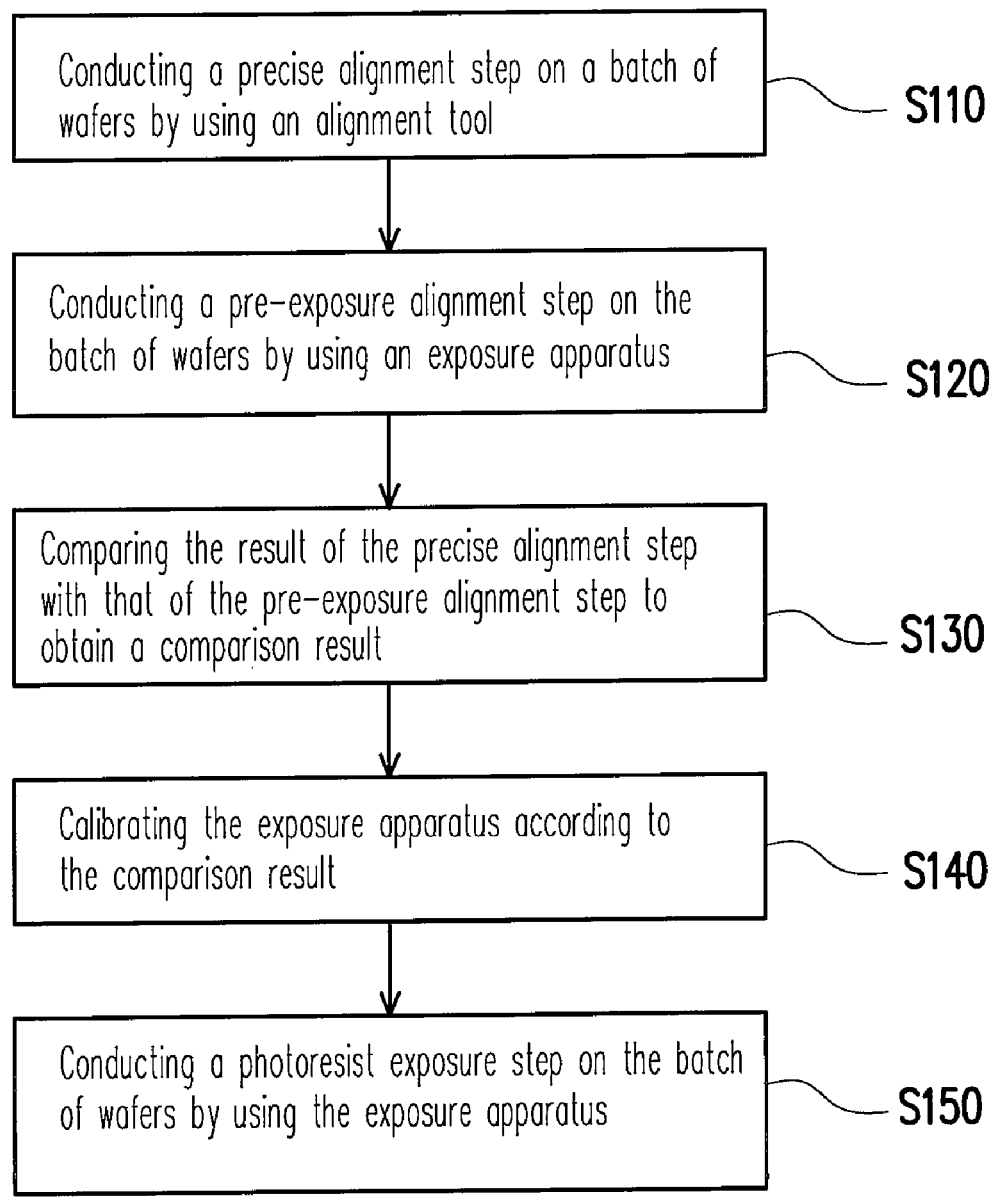
FIG. 1 is a flowchart of an exposure method according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flowchart of an exposure method according to an embodiment of the present invention. The exposure method is suitable for a photolithography process, wherein a photoresist layer has been formed on the surface of each wafer.

Referring to FIG. 1, first in step S110, an alignment tool is used to conduct a first alignment step, i.e. a precise alignment step, on a batch of wafers. The precise alignment step is, for example, performing a precise alignment measurement on each wafer of the batch. In other words, in the precise alignment step, the number of the alignment marks measured on a wafer ranges between 400 and 500.

The alignment tool used in step S110 is, for example, an off-line alignment tool, so that the alignment tool and the exposure apparatus used in the successive photoresist exposure step are respectively independently disposed. Besides, the alignment tool can be a tool having a wafer alignment function, and the alignment accuracy thereof roughly equals to the alignment accuracy of the exposure apparatus used in the successive photoresist exposure step. In the present embodiment, the alignment tool employed is the same as the exposure apparatus employed in the photoresist exposure step.

In general, the precise alignment measurement depends on the apparatus which is in use. In an embodiment, the actual site of the alignment mark is detected by a signal generated from the alignment mark. In another embodiment, the actual site of the alignment mark is detected by signals with different diffraction orders generated from the alignment mark. The exposure apparatus can be compensated during the exposure process by correlating the actual site of the alignment mark with the expected site thereof provided by the exposure apparatus to improve alignment accuracy between two overlapping layers.

In a typical exposure process, each wafer should be compensated with the outcome of the alignment marks in each wafer by the apparatus. The number of the alignment marks measured in the precise alignment step which ranges between 400 and 500 aims to get more data for high-order operation. If the exposure process is supposed to be stable in a continuous run fab, the high-order measured from the first wafer can represent that of the entire wafers of the batch. That is to say, in dynamic compensation, the correlation from the first measured wafer can be utilized on any wafer of the same batch or even other batches. As for static compensation, an average correlation got from the measurement of the whole batch of wafers can be introduces into parameters of the apparatus.

It is noted that the alignment tool used in the present embodiment is identical to the exposure apparatus used in the photoresist exposure step, however the present invention is not limited thereto as such. In other embodiments, other tools having a wafer alignment function may also be used to conduct step S110.

Next, in step S120, an exposure apparatus is used to conduct a second alignment step, i.e. a pre-exposure alignment step, on the batch of wafers. The pre-exposure alignment step is, for example, performing a coarse alignment measurement on partial wafers or on each wafer of the batch. A smaller number of the alignment marks may be measured on a wafer in the pre-exposure alignment step (step S120) than that in the precise alignment step (step S110). In the present embodiment, the number of the alignment marks measured on a wafer ranges between 10 and 40 in the pre-exposure alignment step.

The exposure apparatus used in step S120 can be a step-and-scan scanner or a stepper. And, the exposure apparatus is, for example, coupled to the alignment tool used in step S110.

The principle of the pre-exposure alignment step is similar to that of the precise alignment step as described in detail above, while the difference therebetween lies in the number of the measured alignment marks. In an embodiment, the alignment marks measured in the pre-exposure step is a portion of the alignment marks measured in the precise step. As the alignment marks measured in the pre-exposure step correlate with the identical alignment marks measured in the precise step, bias between the exposure apparatus utilized in step S120 and the alignment tool utilized in step S110 could be regulate to zero in subsequent process steps. Therefore, one goal in the pre-exposure alignment (step S120) is to adjust the correlation of the pre-exposure alignment to be equal to the correlation generated from the precise alignment (step S110).

Next, in step S130, the result obtained in the precise alignment step is compared with the result obtained in the pre-exposure alignment step to get a comparison result. In the present embodiment, the alignment tool used in step S110 and the exposure apparatus used in step S120 are the identical instrument, and both of the alignment tool and the exposure apparatus are disposed in the same working environment and sharing the same setting. Thus, the pre-exposure alignment step performed in step S120 needs fewer measured alignment marks to obtain a comparison result by comparing with the resulting data of precise alignment step performed in step S110 or through calculation.

Next, in step S140, the exposure apparatus is calibrated according to the comparison result. In more detail, calibrating the exposure apparatus by means of the above-mentioned comparison result, for example, uses a feedback mechanism so as to automatically feed back the comparison result to the exposure apparatus for calibration. Since the alignment tool has been used to conduct the precise alignment step on the wafer previously, in a manner using the comparison result to carry out the calibration job for the exposure apparatus, the alignment accuracy on the wafer may be effectively promoted.

It should be noted that the data measured by the off-line alignment tool is the same as the data measured by the in-line exposure apparatus with respect to the identical alignment marks. Therefore, the off-line alignment tool aims to reduce the time which the wafers spend on the in-line exposure apparatus so as to enhance yield.

Next, in step S150, the exposure apparatus is used to conduct the photoresist exposure step on the batch of wafers. The details of the photoresist exposure step and the successive photolithography process should be known by anyone skilled in the art and are omitted to describe herein.

More specifically, since the alignment tool and the exposure apparatus are disposed independently from each other, while the exposure apparatus conducts the pre-exposure alignment step or the photoresist exposure step, the alignment tool can simultaneously and continuously conduct the precise alignment step on other batches of wafers to provide precise alignment data of other batches for calibrating the exposure apparatus subsequently. Furthermore, the precise alignment step conducted by using the independently disposed alignment tool would not affect the operation of the exposure apparatus, which can reduce the time the exposure apparatus conducting the alignment and also allow the exposure apparatus to focus on the photoresist exposure step for increasing throughput. Besides, since the number of the alignment marks measured in the precise alignment step is greater than that in the pre-exposure alignment step, the scheme of comparing the result obtained by the precise alignment step with the result obtained by the pre-exposure alignment step, followed by feeding back the comparison result to the exposure apparatus can promote the alignment accuracy on wafers.

In order to show the efficiency of the exposure method of the present invention, the following two examples are described. The comparisons of the photolithography process employing an embodiment of the present invention and the conventional photolithography process, and the relationship between the throughput of the photolithography process and the number of the measured alignment marks are described.

The Examples

Figure 2A:
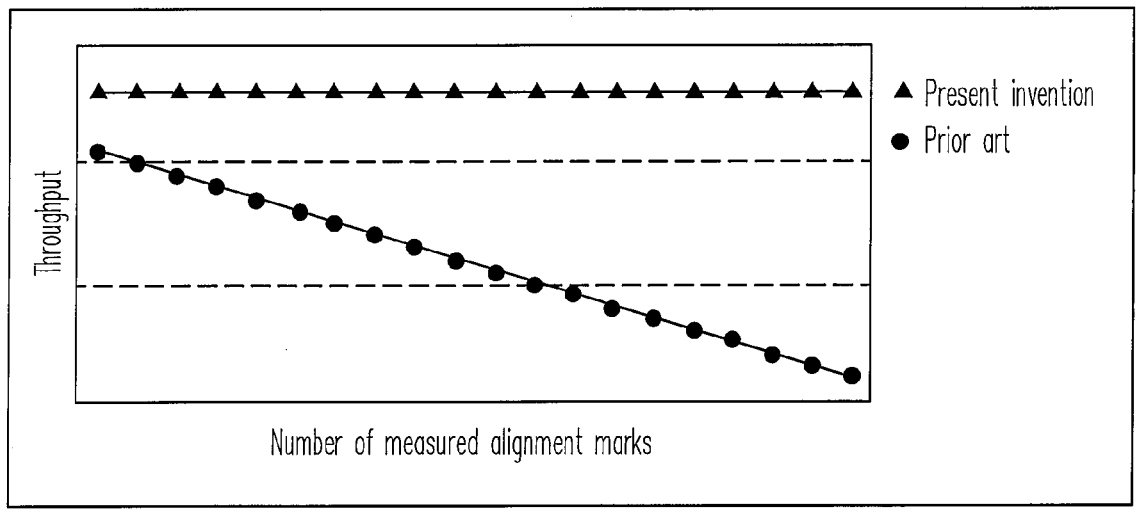
FIG. 2A is a distribution curve of throughput over number of measured alignment marks according to an example of the present invention.
Figure 2B:
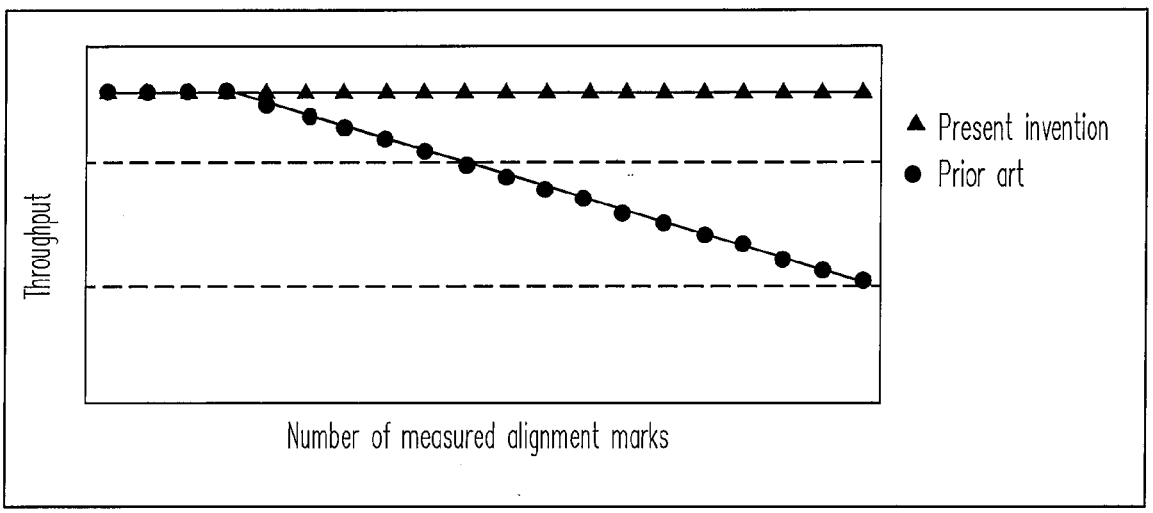
FIG. 2B is a distribution curve of throughput over number of measured alignment marks according to another example of the present invention.

FIG. 2A is a distribution curve of throughput over number of measured alignment marks according to an example of the present invention and FIG. 2B is a distribution curve of throughput over number of measured alignment marks according to another example of the present invention.

FIG. 2A shows the measurement by using a single-stage exposure apparatus, that is, the pre-exposure alignment step and the photoresist exposure step on wafers are performed at the same wafer chuck. As shown by FIG. 2A, by using the conventional exposure method, the throughput of the exposure apparatus is gradually decreased with the increasing number of the measured alignment marks on a wafer. However, by using the exposure method of the present invention, the throughput of the exposure apparatus remains steady with the increasing number of the measured alignment marks on a wafer.

FIG. 2B shows the measurement by using a twin-stage exposure apparatus, that is, the pre-exposure alignment step and the photoresist exposure step on wafers are respectively performed at two different wafer chucks in the same exposure apparatus. As shown by FIG. 2B, by using the conventional exposure method, although the throughput thereof seems not much changed with the increasing number of the measured alignment marks at beginning, the throughput thereof is decreased with the increasing number of the measured alignment marks on a wafer after the number of the measured alignment marks meets a certain value. On the other hand, by using the exposure method of the present invention, the throughput of the exposure apparatus still keeps an stable level with the increasing number of the measured alignment marks on a wafer.

The above-mentioned positive results of FIGS. 2A and 2B are under favor of the exposure method of the present invention which uses the alignment tool to conduct precise alignment measurement on the wafer in advance, so that the number of the measured alignment marks does not affect the operation of the exposure apparatus, and the throughput of the exposure apparatus can effectively keep at an appropriate level regardless of the increasing number of the measured alignment marks at the same time.

In summary, the exposure method of the present invention at least has following advantages.

1. Because a precise alignment step is conducted on a wafer in advance, followed by sequentially conducting a pre-exposure alignment step and a photoresist exposure step on the wafer, the alignment accuracy can be effectively promoted and the quality of pattern transferring in a photolithography process may be ensured.

2. An off-line and independently disposed alignment tool is employed to conduct a precise alignment measurement, and therefore, the exposure apparatus needs to only conduct the coarse alignment measurement on the wafer for effectively promoting the throughput. Besides, the alignment tool and the exposure apparatus independently disposed from each other are able to respectively conduct the processes at the same time, which results in further reduction in the process time.

3. Because the alignment tool and the exposure apparatus have the same measurement method and unified setting, the correlation between the result obtained by the alignment tool and the result obtained by the exposure apparatus can be used for easily and correctly calibrating the exposure apparatus by using a feedback mechanism.

4. The method of the present invention may be applied to various exposure apparatuses in any photolithography process in use today. In particular, the exposure method of the present invention is a simple method, capable of promoting the alignment accuracy, increasing the throughput and reducing the overall fabrication cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An exposure method, suitable for a photolithography process, comprising:
   providing a wafer with a group of alignment marks thereon;
   conducting a first alignment step by using the group of alignment marks on the wafer in an alignment tool to obtain a first calibration data;
   after conducting the first alignment step, conducting a second alignment step by using a portion of the group of alignment marks on the wafer in an exposure tool to obtain a second calibration data;
   comparing the first calibration data with the second calibration data to obtain a comparison result; and
   conducting a photoresist exposure step on the wafer according to the comparison result in the exposure tool.

2. The exposure method according to claim 1, wherein the alignment tool is an off-line system.

3. An alignment method, suitable for a photolithography process, comprising:
   conducting a first alignment step on a first batch of wafers by using an alignment tool, wherein the first alignment step comprises a precise alignment measurement;
   conducting a second alignment step on the first batch of wafers by using an exposure apparatus after conducting the first alignment step on the first batch of wafers, wherein the second alignment step comprises a coarse alignment measurement;
   comparing a result of the first alignment step conducted on the first batch of wafers and a result of the second alignment step conducted on the first batch of wafers to obtain a comparison result;
   calibrating the exposure apparatus according to the comparison result; and
   conducting a photoresist exposure step on the first batch of wafers by using the exposure apparatus.

4. The exposure method according to claim 3, wherein the first alignment step comprises conducting the precise alignment measurement on each wafer of the first batch of wafers.

5. The exposure method according to claim 4, wherein the second alignment step comprises conducting the coarse alignment measurement on a portion of the wafers or on each wafer of the first batch of wafers.

6. The exposure method according to claim 5, wherein a number of alignment marks measured in the first alignment step is greater than a number of alignment marks measured in the second alignment step.

7. The exposure method according to claim 6, wherein the alignment tool is an off-line alignment tool.

8. The exposure method according to claim 7, wherein the off-line alignment tool is coupled to the exposure apparatus.

9. The exposure method according to claim 8, wherein calibrating the exposure apparatus according to the comparison result comprises using a feedback mechanism to automatically feed back the comparison result to the exposure apparatus for calibration.

10. The exposure method according to claim 3, further comprising conducting the first alignment step on a second batch of wafers by using the alignment tool.

11. The exposure method according to claim 10, wherein conducting the first alignment step on the second batch of wafers are simultaneous with conducting the second alignment step on the first batch of wafers.

12. The exposure method according to claim 11, wherein the alignment tool is an off-line alignment tool.

13. The exposure method according to claim 12, wherein the off-line alignment tool is coupled to the exposure apparatus.

14. The exposure method according to claim 13, wherein calibrating the exposure apparatus according to the comparison result comprises using a feedback mechanism to automatically feed back the comparison result to the exposure apparatus for calibration.

* * * * *